(12) United States Patent
DeBrosse et al.

(10) Patent No.: US 10,170,178 B2
(45) Date of Patent: Jan. 1, 2019

(54) SECURE OFF-CHIP MRAM

(71) Applicant: International Business Machines Corporation, Armonk, NY (US)

(72) Inventors: John K. DeBrosse, Colchester, VT (US); William E. Hall, Clinton, CT (US); Hillery C. Hunter, Chappaqua, NY (US); Jeffrey A. Stuecheli, Austin, TX (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/590,521

(22) Filed: May 9, 2017

(65) Prior Publication Data

US 2018/0330779 A1    Nov. 15, 2018

(51) Int. Cl.
*G11C 11/30* (2006.01)
*G11C 11/56* (2006.01)
*G11C 16/10* (2006.01)
*G11C 16/34* (2006.01)
*G06F 11/22* (2006.01)

(52) U.S. Cl.
CPC ........ *G11C 11/5607* (2013.01); *G11C 16/105* (2013.01); *G11C 16/3481* (2013.01); *G06F 11/2215* (2013.01); *G11C 16/3445* (2013.01); *G11C 16/3459* (2013.01); *G11C 16/3463* (2013.01)

(58) Field of Classification Search
CPC .............. G11C 11/5607; G11C 16/105; G11C 16/3481

USPC ................................................... 365/50, 158
See application file for complete search history.

(56) References Cited

U.S. PATENT DOCUMENTS

| | | |
|---|---|---|
| 4,959,860 A | 9/1990 | Watters et al. |
| 6,173,412 B1 | 1/2001 | Isozaki et al. |
| 6,965,989 B1 | 11/2005 | Strange et al. |
| 7,111,029 B2 | 9/2006 | Fujita et al. |
| 7,116,969 B2 | 10/2006 | Park |
| 7,722,468 B2 | 5/2010 | Cockerille et al. |
| 8,370,714 B2 | 2/2013 | DeBrosse et al. |
| 8,823,418 B2 | 9/2014 | Chang et al. |

(Continued)

OTHER PUBLICATIONS

Ramya et al., "Design of Non-Volatile Memory Based on Improved Writing Circuit STT-MRAM Technique," International Journal of Innovative Research in Science, Engineering and Technology, vol. 4, issue 5, pp. 108-114 (Apr. 2015).

*Primary Examiner* — Anthan Tran
(74) *Attorney, Agent, or Firm* — Vazken Alexanian; Michael J. Chang, LLC

(57) ABSTRACT

Techniques for improving the security of nonvolatile memory such as magnetic random access memory (MRAM) are provided. In one aspect, a method of operating a nonvolatile memory chip is provided. The method includes: overwriting data stored on the nonvolatile memory chip automatically upon the nonvolatile memory chip being powered on. For example, all bits in the nonvolatile memory chip can be written to either i) a predetermined data state (e.g., a logic 1 or a logic 0) or ii) a random data state. A system is also provided that includes: a nonvolatile memory chip; and a writing circuit configured to overwrite data stored on the nonvolatile memory chip automatically upon the nonvolatile memory chip being powered on.

19 Claims, 4 Drawing Sheets

(56) References Cited

U.S. PATENT DOCUMENTS

| | | |
|---|---|---|
| 2006/0205513 A1 | 9/2006 | Breckner et al. |
| 2012/0087176 A1* | 4/2012 | Behrends ............... G11C 5/145 |
| | | 365/149 |
| 2012/0216001 A1* | 8/2012 | Ramly .................... G06F 21/87 |
| | | 711/163 |
| 2013/0250705 A1 | 9/2013 | Kang |
| 2015/0052341 A1 | 2/2015 | Saiki |
| 2016/0283151 A1* | 9/2016 | Chinnakkonda |
| | | Vidyapoornachary ...................... |
| | | G06F 3/0623 |

* cited by examiner

*FIG.* 4
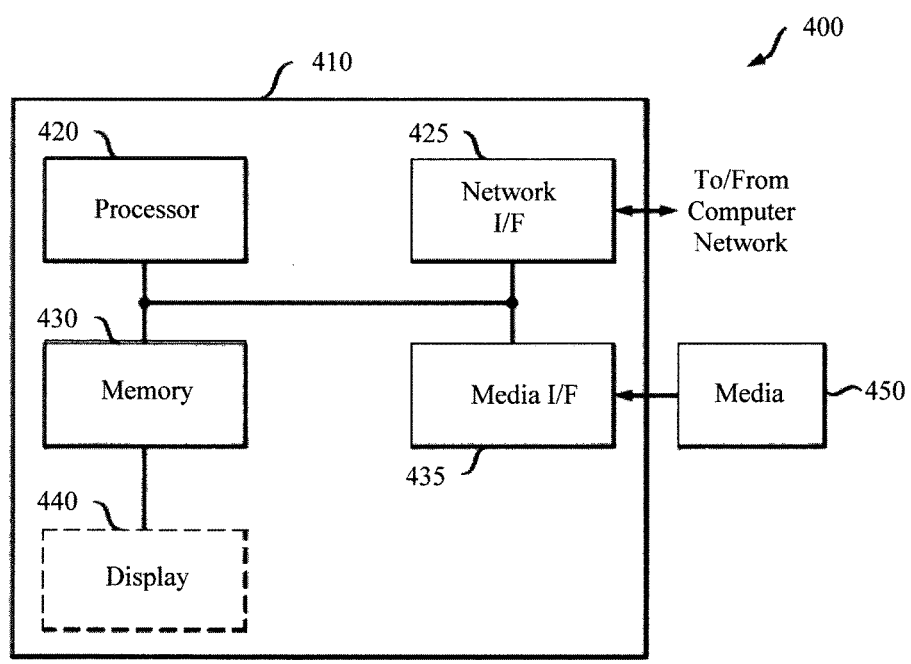

SECURE OFF-CHIP MRAM

FIELD OF THE INVENTION

The present invention relates to nonvolatile memory such as magnetic random access memory (MRAM), and more particularly, to techniques for improving the security of nonvolatile memory.

BACKGROUND OF THE INVENTION

Magnetic random access memory or MRAM is a nonvolatile random access memory technology. When MRAM is used as an off-chip cache, there is a security risk due to the MRAM being nonvolatile.

For instance, since the MRAM retains its data after being powered off, someone could walk off with a board, power it on, and read all the data in the MRAM. The MRAM is naturally nonvolatile, so there is no way to design it to be volatile.

Thus, techniques for preventing data retrieval from nonvolatile memory, such as MRAM, when used as an off-chip cache would be desirable.

SUMMARY OF THE INVENTION

The present invention provides techniques for improving the security of nonvolatile memory such as magnetic random access memory (MRAM). In one aspect of the invention, a method of operating a nonvolatile memory chip, e.g., an MRAM chip, is provided. The method includes the step of: overwriting data stored on the nonvolatile memory chip automatically upon the nonvolatile memory chip being powered on. For example, all bits in the nonvolatile memory chip can be written to either i) a predetermined data state (e.g., a logic 1 or a logic 0) or ii) a random data state.

In another aspect of the invention, a system is provided. The system includes: a nonvolatile memory chip, e.g., an MRAM chip; and a writing circuit configured to overwrite data stored on the nonvolatile memory chip automatically upon the nonvolatile memory chip being powered on. The system can also include a power-on-detector (POD) circuit configured to generate a signal upon the nonvolatile memory chip being powered on, and a clock generator circuit configured to generate a clock signal upon receipt of the signal from the POD circuit.

A more complete understanding of the present invention, as well as further features and advantages of the present invention, will be obtained by reference to the following detailed description and drawings.

BRIEF DESCRIPTION OF THE DRAWINGS

FIG. 4 is a diagram illustrating an exemplary apparatus for performing one or more of the methodologies presented herein according to an embodiment of the present invention.

DETAILED DESCRIPTION OF PREFERRED EMBODIMENTS

Figure 1:
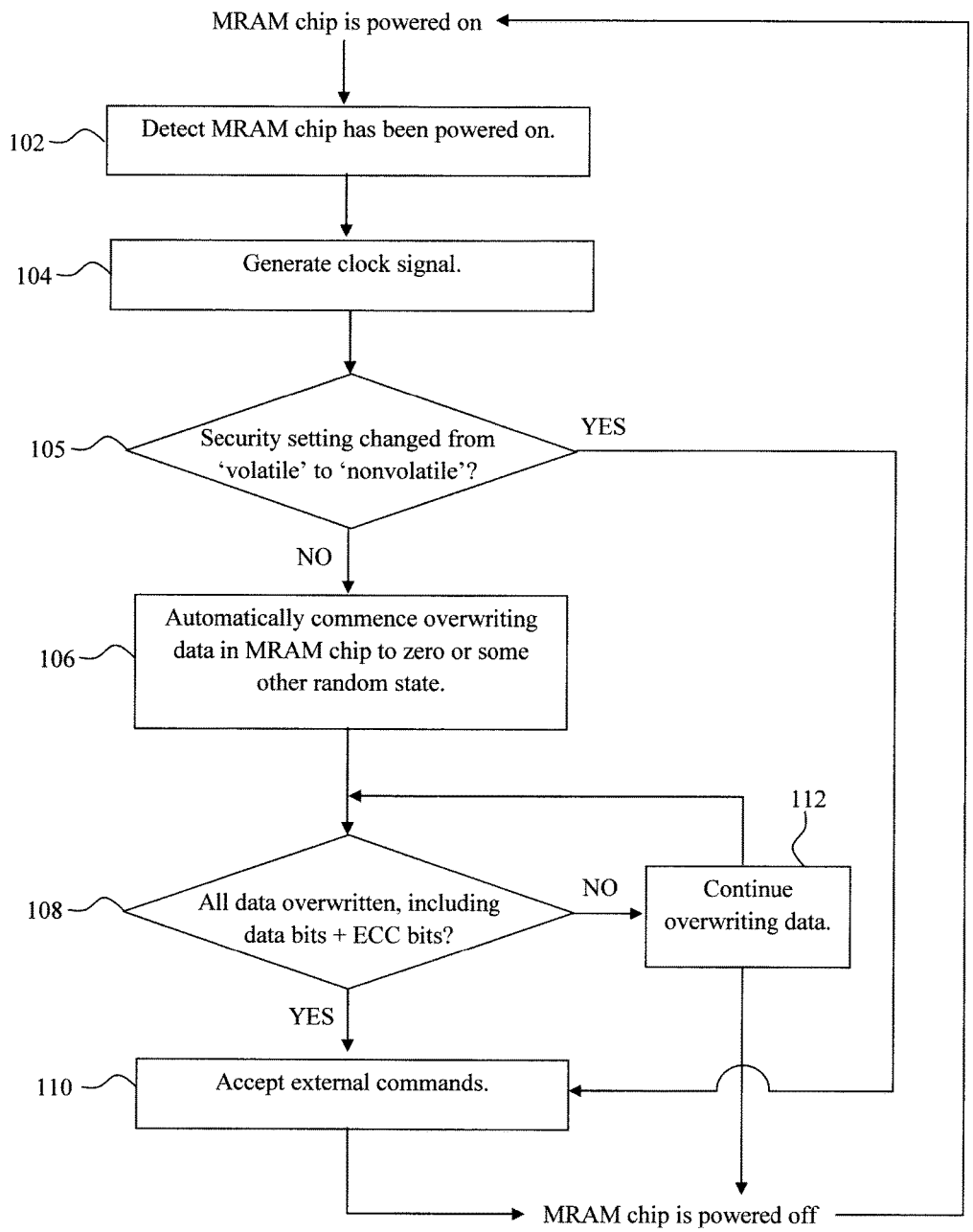
FIG. 1 is a diagram illustrating an exemplary methodology for operating a magnetic random access memory (MRAM) chip in a 'volatile' security setting mode according to an embodiment of the present invention.

Provided herein are techniques for preventing the unauthorized retrieval of data from nonvolatile memory such as magnetic random access memory (MRAM). As provided above, due to MRAM being naturally nonvolatile, someone in possession of the board can simply power it on, and read all the data retained in the MRAM. This can pose significant security concerns.

MRAM uses magnetic memory cells to store information. Information is stored in the magnetic memory cells as an orientation of the magnetization of a free layer as compared to an orientation of the magnetization of a fixed or reference layer in each of the magnetic memory cells. The magnetization of the free layer can be oriented parallel or antiparallel relative to the fixed layer, representing either a logic "1" or a logic "0." When the magnetic memory cell is sitting in a zero applied magnetic field, the magnetization of the magnetic memory cell is stable. Hence, the memory is nonvolatile. The application of a magnetic field can switch the magnetization of the free layer to write information to the magnetic memory cell.

Advantageously, according to the present techniques, the MRAM chip is designed such that every time the chip is powered on, it automatically writes all of the data to zero, or some random data state—essentially erasing all of the data stored on the chip. This function includes the data bits as well as the error-correcting code (ECC) bits.

It is only once all of the data and ECC bits have been rewritten that the present MRAM chip design will be usable for its normal data function. Thus, even if one were to power-off the chip while this initial process of erasing existing data was being performed, the process would automatically start again once the chip is again powered on, and would not stop until all data and ECC bits have been written.

The process begins automatically whenever the chip is powered-up. Thus, no input from the user is needed nor desired since this is a security feature. Further, when set in this volatile erase mode there is nothing the user can do to prevent the process from beginning and running to completion each time the chip is powered up.

It is notable that while the description references MRAM as an example, the present techniques are more broadly applicable to any type of nonvolatile memory. For instance, nonvolatile memory that can benefit from the present techniques include, but are not limited to, flash memory, phase-change memory (PCM), etc.

Going forward, once the data has been erased, the user might be given the option to employ a different security mode other than the above-described "volatile" mode whereby data is erased each time the chip is powered up. For example, the purpose is to prevent nefarious access to the data retained on the MRAM chip. However, an authorized user might be legitimately using the device when a power outage occurs. Instead of having the data automatically erased on power-up, the user can elect to operate the chip in an alternative mode, termed "nonvolatile mode" whereby the data is retained even after power-up, in accordance with conventional MRAM device operations.

Methodology 100 of FIG. 1 provides an overview of the present process. As shown in FIG. 1, the process will automatically commence overwriting all of the data on the chip anytime the MRAM chip is powered on. The one caveat is that the user might be given the option to change the security setting by switching the chip to a 'nonvolatile' mode. In that case, subsequently powering the chip back on will not automatically trigger a rewrite. This optional security setting feature will be described in further detail below. Notwithstanding, it is preferable that the overwriting process of FIG. 1 be performed initially, at least once prior to giving the user the option to change the security setting.

In step 102, the detection that the MRAM chip has been powered on commences the process. As will be described in detail below, a power-on-detector or POD circuit may be implemented to monitor the chip status, i.e., powered on or powered off.

In step 104, upon receiving a signal that the chip has been powered on, a clock signal is generated. In electronic devices, a clock signal is used as a timing reference for various operations, in this case an overwrite operation. As will be described in detail below, a clock generator circuit may be implemented to generate the clock signal anytime the chip is powered on.

As highlighted above, it may be desirable to give users the option to change the security settings from a 'volatile' mode to a 'nonvolatile' mode whereby data is not automatically erased on powering up the device. This feature will be described in further detail in conjunction with the description of FIG. 2, below. Thus optionally, in step 105, a determination can be made as to whether the security setting has been changed to the 'nonvolatile' mode. If it is determined in step 105 that (NO) the security setting has not been changed from 'volatile' to 'nonvolatile' mode, then the process proceeds as per step 106 to automatically overwrite the data on the chip. However, on the other hand, if it is determined in step 105 that (YES) the security setting has not been changed from 'volatile' to 'nonvolatile' mode, then the overwriting process is bypassed and the chip is free to accept external commands (see step 110).

In step 106, all of the data stored on the chip is automatically overwritten. As will be described in detail below, an MRAM writing circuit may be implemented to overwrite the data. According to one exemplary embodiment, step 106 involves writing all of the data on the chip (data and ECC bits) to a predetermined data state, such as either a zero (0) state or a one (1) state. Thus, regardless of whether a given bit was storing a logic 1 or 0, it will now be rewritten to a logic 0 or a logic 1 (whichever is the predetermined logic state). Thus, the pre-existing data stored on the chip will be erased upon power up, and therefore inaccessible. According to another exemplary embodiment, the bits are written to a random state. Thus, each bit will randomly be rewritten to either a logic 1 or a logic 0. As will be described in detail below, a digital logic random number generator circuit may be implemented to generate the random logic state. In either case, any existing data on the chip will be erased.

This process proceeds until all data (including ECC data) on the chip is overwritten. See step 108. As is known in the art, ECC bits store redundant data in case errors occur in the data bits. Thus, for the purpose of security it is desirable to overwrite the data in the ECC bits as well. According to an exemplary embodiment, the overwriting process starts at the first word and then overwrites each word one by one until it gets to the last word, i.e., like a big FOR LOOP. Thus, it is known how many words exists which enables the process to run until the last word is overwritten.

If it is determined that in step 108 that (YES) the process has run to completion and all of the bits on the chip have been overwritten, then normal operations commence and the chip is free to accept external commands. See step 110. As shown in FIG. 1, in the default state (where the security setting of 'volatile' mode remains in place) anytime the chip is powered off and on again, the process of overwriting the bits automatically starts again at the beginning (as per step 102 of methodology 100).

On the other hand, if it is determined in step 108 that (NO) not all of the bits in the chip have been overwritten, then the overwriting process continues as per step 112. However, as shown in FIG. 1, if by chance the chip is powered off during the overwriting process then when it is again powered on the process of overwriting the bits automatically starts again at the beginning (as per step 102 of methodology 100). Thus, there is no way for one to bypass the overwrite process from running to completion.

As provided above, it may be desirable for the user to be given the option to change the security settings from the 'volatile' mode shown in FIG. 1 to a 'nonvolatile' mode whereby data is not automatically erased on powering up the device. This might be useful in the case, for example, where there are debugging issues associated with power outages and a legitimate user does not want to lose stored data upon powering on the chip. In that case, the user might be given the option to change the security setting as shown in methodology 200 of FIG. 2.

As highlighted above, for security assurances, it is preferable that the 'volatile' mode is the default setting such that the steps of methodology 100 are run at least once prior to permitting the user to change the security setting. This can help insure that only a legitimate user can change the setting. Thus, FIG. 2 begins at the stage where methodology 100 has been performed, the chip is powered on, all existing data has been overwritten, and the chip is free to accept external commands.

In step 202, the user is given the option to change the security setting from the volatile mode (preferably the default) of methodology 100 to a nonvolatile mode. Doing so means that that user desires to retain stored data even after the chip has been powered off. Accordingly, when the chip is powered off and then back on again, a determination is made as whether the security setting has been changed to 'nonvolatile' mode. See step 204.

Figure 2:
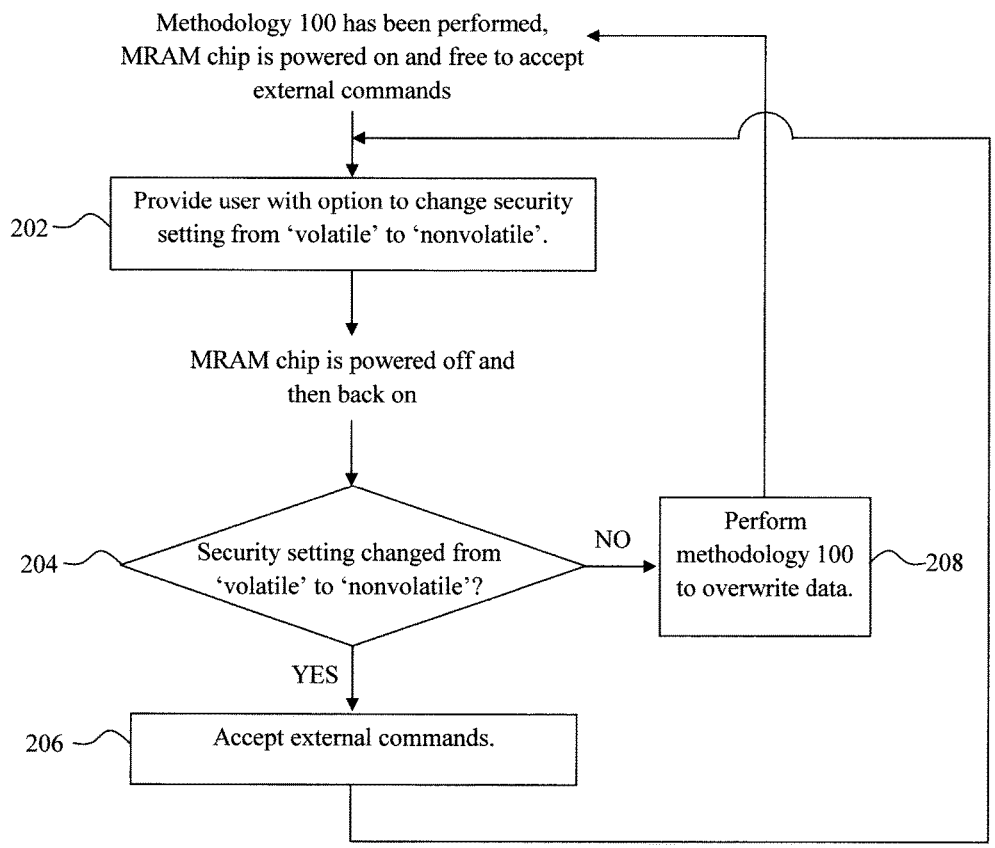
FIG. 2 is a diagram illustrating an exemplary methodology for operating the MRAM chip in an optional 'nonvolatile' security setting mode according to an embodiment of the present invention.

If it is determined in step 204 that (YES) the security setting has been changed from 'volatile' to 'nonvolatile' mode, then the overwriting process of methodology 100 is bypassed and data is retained in the chip. As per step 206, the chip is ready to accept external commands and perform normal operations. As shown in FIG. 2, the user is free to change the setting, i.e., back to 'volatile' mode.

On the other hand, if it is determined in step 204 that (NO) the security setting has not been changed from 'volatile' to 'nonvolatile' mode, then the (default) 'volatile' mode remains in place, and the overwriting process of methodology 100 is performed on chip power up automatically, without any input from the user, as per step 208.

While given the option to change the security setting, a user might however choose to maintain the 'volatile' mode under normal use. By contrast, when the device is being debugged, the user can easily alter the setting to prevent data loss due to unintended power interruptions.

According to an exemplary embodiment, methodology 200 is implemented using flags to designate the security setting as either 'volatile' or 'nonvolatile' mode. An authorized user can adjust the security setting by setting a flag in the MRAM memory. The flags are stored in one or more bits and take advantage of the nonvolatility of the MRAM. Thus the mode is retained after the device is powered off.

While the flag can be implemented using a single bit, for security reasons it is preferable to store the flag in multiple bits, in different states. Further, the bits used to store the flag are preferably physically close to one another, such as adjacent bits in the chip. These factors help insure that someone cannot impermissibly rewrite the flag to change the security setting. For instance, someone with access to the chip might try to apply an external magnetic field to rewrite the flag from 'volatile' to 'nonvolatile' in an attempt to bypass the overwriting process of methodology 100 and gain access to the data stored on the chip. However, it would be extremely difficult to use an external magnetic field to change one bit without disrupting other adjacent bits. Thus, changing multiple adjacent bits in this manner would be virtually impossible.

By way of example only, according to one non-limiting example, the flag is stored in five adjacent bits. The bits are not all stored in the same state, e.g., three '0' and two '1', versus three '1' and two '0'. For instance, three '0' and two '1' means 'volatile' mode, and three '1' and two '0' means 'nonvolatile' mode, or vice versa. If less than four of the five (or, for greater security, less than five of the five) bits agree, the default is to use volatile mode.

For an enhanced level of security, an encryption option for the 'nonvolatile' mode can also be available whereby a user can elect i) to switch the security setting, i.e., to 'nonvolatile' mode as described above and, within 'nonvolatile' mode, ii) implement encryption (or no encryption). By way of example only, the encryption option involves encrypting and decrypting the data as it is being written and read, as opposed to simply writing and reading the data with no encryption. If the encrypt/decrypt data option is selected, then the data is encrypted and decrypted using a volatile encryption key provided, e.g., by the user. The encryption option too can be implemented using flags, just with an additional setting. For example, with an encryption option there would be three settings for the flag: 1) 'volatile' mode, 2) 'nonvolatile' mode, and 3) encrypted.

Figure 3:
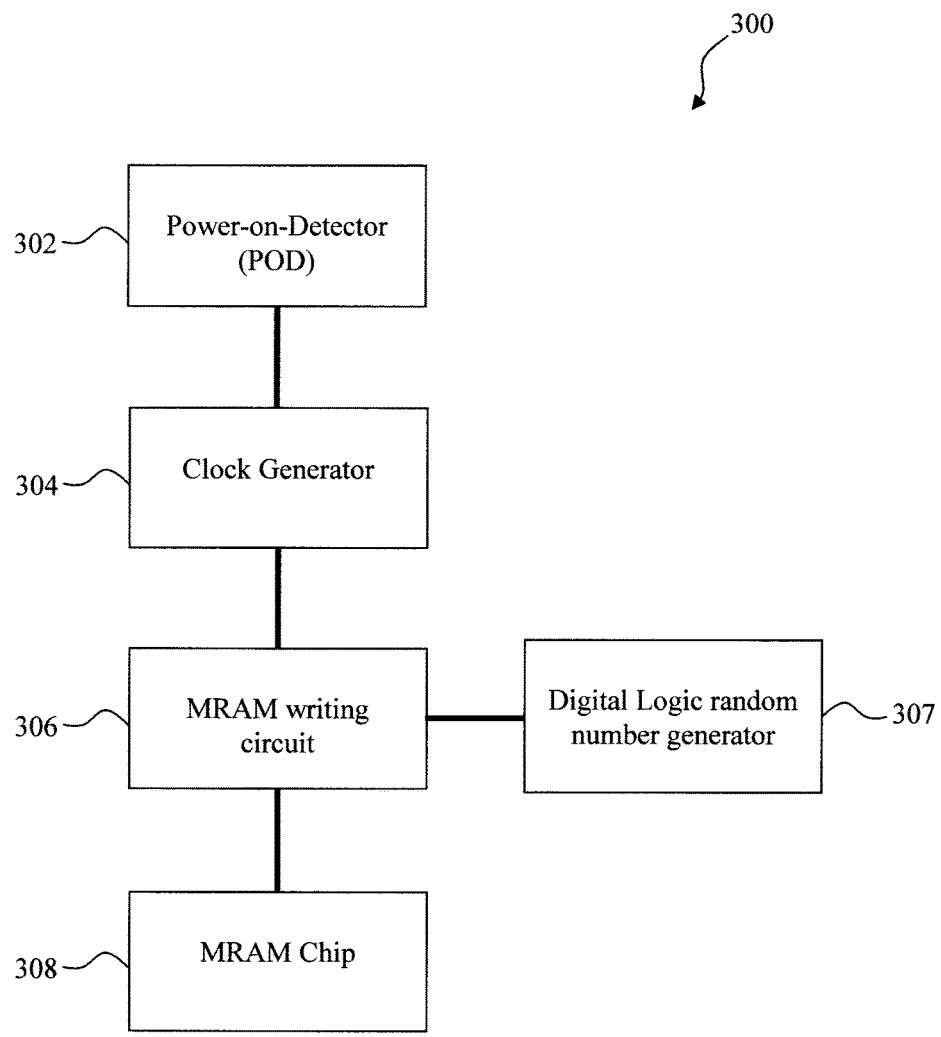
FIG. 3 is a schematic diagram illustrating an exemplary system for implementing the present techniques according to an embodiment of the present invention.

FIG. 3 is a schematic diagram illustrating an exemplary system 300 for implementing the present techniques. As shown in FIG. 3, system 300 includes a power-on-detector or POD circuit 302, a clock generator circuit 304, an MRAM writing circuit 306, an (optional) digital logic random number generator 307, and the MRAM chip 308.

The POD circuit 302 detects when the MRAM chip 308 is powered on. See, for example, step 102 of FIG. 1. As described above, the default 'volatile' security mode to overwrite data stored on the MRAM chip automatically commences whenever the MRAM chip is powered on. Thus the POD circuit 302 signals when the chip is being powered on thereby initiating the process. A POD circuit that may be used in accordance with the present techniques is provided in U.S. Pat. No. 8,823,418 issued to Chang et al., entitled "Power On Detection Circuit" (hereinafter "U.S. Pat. No. 8,823,418"), the contents of which are incorporated by reference as if fully set forth herein. As described in U.S. Pat. No. 8,823,418, POD circuits provide a signal that indicates when the voltage level of a power supply source has reached a predetermined level.

A signal from the POD circuit 302 initiates the clock generator circuit 304 to generate a clock signal. See, for example, step 104 of FIG. 1. In electronic devices in general, a clock signal is used as a timing reference for various operations. See, for example, U.S. Patent Application Publication Number 2013/0250705 by Kang, entitled "Clock Signal Generation Apparatus for Use in Semiconductor Memory Device and Its Method," the contents of which are incorporated by reference as if fully set forth herein. In accordance with the present techniques, the clock signal is used to time the above-described overwriting process for the MRAM chip 308. Further, even if the chip is powered off during the overwriting process, upon being powered on again a signal from the POD circuit 302 will initiate generation of a clock signal from the clock generator circuit 304, and the overwriting process will begin again from the start.

The overwriting of the data in the MRAM chip 308 is carried out via the MRAM writing circuit 306. Any MRAM read/write circuit may be employed, including those described in Ramya et al., "Design of Non-Volatile Memory Based On Improved Writing Circuit STT-MRAM Technique," International Journal of Innovative Research in Science, Engineering and Technology, vol. 4, issue 5 (April 2015), the contents of which are incorporated by reference as if fully set forth herein.

As provided above, all of the data on the MRAM chip 308 (including all data bits and ECC bits) is written to a predetermined data state (such as zero (0) or one (1)) or a random data state. See, for example, step 106 of FIG. 1. This operation is performed by the MRAM writing circuit 306. It is only once all of the data on the chip has been overwritten that the MRAM chip 308 will accept external commands (including the option to change the security setting mode as described above).

In order to select a random data state, an optional digital logic random number generator 307 can be employed. The digital logic random number generator 307 is a circuit that randomly selects a data state (e.g., a logic zero (0) or one (1)) to overwrite each bit. A suitable random number circuit is described, for example, in U.S. Pat. No. 7,111,029 issued to Fujita et al., entitled "Random Number Generating Circuit," the contents of which are incorporated by reference as if fully set forth herein.

FIG. 4 is a diagram illustrating an exemplary apparatus 400 in which system 300 may be embodied to perform the present techniques. By way of example only, apparatus 400 can be configured to implement one or more of the steps of methodology 100 of FIG. 1 and/or one or more of the steps of methodology 200 of FIG. 2.

Apparatus 400 includes a computer system 410 and removable media 450. Computer system 410 includes a processor device 420, a network interface 425, a memory 430, a media interface 435 and an optional display 440. Network interface 425 allows computer system 410 to connect to a network, while media interface 435 allows computer system 410 to interact with media, such as a hard drive or removable media 450.

Processor device 420 can be configured to implement the methods, steps, and functions disclosed herein. The memory 430 could be distributed or local and the processor device 420 could be distributed or singular. The memory 430 could be implemented as an electrical, magnetic or optical memory, or any combination of these or other types of storage devices. Moreover, the term "memory" should be construed broadly enough to encompass any information able to be read from, or written to, an address in the addressable space accessed by processor device 420. With this definition, information on a network, accessible through network interface 425, is still within memory 430 because the processor device 420 can retrieve the information from the network. It should be noted that each distributed processor that makes up processor device 420 generally contains its own addressable memory space. It should also be noted that some or all of computer system 410 can be incorporated into an application-specific or general-use integrated circuit.

Optional display 440 is any type of display suitable for interacting with a human user of apparatus 400. Generally, display 440 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of operating a nonvolatile memory chip, comprising the steps of:
    overwriting data stored on the nonvolatile memory chip automatically upon the nonvolatile memory chip being powered on; and
    providing a user with an option to change a security setting from a volatile mode whereby the data is overwritten automatically upon the nonvolatile memory chip being powered on to a nonvolatile mode whereby the overwriting step is bypassed.

2. The method of claim 1, wherein the nonvolatile memory chip comprises a magnetic random access memory (MRAM) chip.

3. The method of claim 1, wherein the step of overwriting comprises the step of:
    writing all bits in the nonvolatile memory chip to either i) a predetermined data state or ii) a random data state.

4. The method of claim 3, wherein the predetermined data state comprises either a logic 1 or a logic 0.

5. The method of claim 3, wherein the bits comprise both data bits and error-correcting code (ECC) hits.

6. The method of claim 3, wherein the overwriting step is completed only when all of the bits in the nonvolatile memory chip have been written.

7. The method of claim 6, wherein the nonvolatile memory chip is powered off while the overwriting step is being performed, the method further comprising the step of:
    restarting the overwriting step automatically when the nonvolatile memory chip is again powered on.

8. The method of claim 1, further comprising the step of: detecting that the nonvolatile memory chip has been powered on.

9. The method of claim 1, further comprising the step of: generating a clock signal upon the nonvolatile memory chip being powered on.

10. The method of claim 1, wherein the user is provided with the option to change the security setting only after the overwriting step has been performed at least once.

11. The method of claim 1, further comprising the step of: storing the security setting as a flag in one or more bits in the nonvolatile memory chip.

12. The method of claim 11, wherein the flag is stored in multiple bits in the nonvolatile memory chip.

13. The method of claim 12, wherein the flag is stored in physically adjacent bits in the nonvolatile memory chip.

14. The method of claim 12, wherein the multiple bits have different logic states depending on whether the security setting is in the volatile mode or in the nonvolatile mode.

15. A system, comprising:
    a nonvolatile memory chip; and
    a writing circuit configured to overwrite data stored on the nonvolatile memory chip automatically upon the nonvolatile memory chip being powered on, after which the nonvolatile memory chip will accept external commands including commands from a user to change a security setting from a volatile mode whereby the data is overwritten automatically upon the nonvolatile memory chip being powered on to a nonvolatile mode whereby overwriting the data is bypassed.

16. The system of claim 15, wherein the nonvolatile memory chip comprises an MRAM chip.

17. The system of claim 15, further comprising:
    a power-on-detector (POD) circuit configured to generate a signal upon the nonvolatile memory chip being powered on.

18. The system of claim 17, further comprising:
    a clock generator circuit configured to generate a clock signal upon receipt of the signal from the POD circuit.

19. The system of claim 18, wherein the writing circuit is configured to overwrite the data stored on the nonvolatile memory chip upon receipt of the clock signal from the clock signal generator.

* * * * *